US005424716A

United States Patent [19]

Park

[11] Patent Number: 5,424,716

[45] Date of Patent: Jun. 13, 1995

[54] PENETRATION DETECTION SYSTEM

[75] Inventor: Kyung T. Park, Berwyn, Pa.

[73] Assignee: The Whitaker Corporation, Wilmington, Del.

[21] Appl. No.: 957,604

[22] Filed: Oct. 6, 1992

[51] Int. Cl.[6] ........................ G08B 13/00; H01L 41/04

[52] U.S. Cl. .................................... 340/550; 310/328; 340/545

[58] Field of Search ........................ 340/550, 565–566, 340/657, 825.59, 541, 545; 310/328, 332; 365/157; 109/41–42; 116/85–86, 203; 215/201, 203; 206/459, 807

[56] References Cited

U.S. PATENT DOCUMENTS

| | | | |
|---|---|---|---|
| 3,441,925 | 4/1969 | White | 340/550 |
| 3,633,194 | 1/1972 | Kothe | 340/550 |
| 3,798,619 | 3/1974 | Samofalov et al. | 365/157 X |
| 4,074,246 | 2/1978 | Conklin et al. | 340/545 X |
| 4,089,927 | 5/1978 | Taylor | 310/331 |
| 4,112,420 | 9/1978 | Mifune et al. | 340/550 |
| 4,194,194 | 3/1980 | Redfern | 340/566 |
| 4,398,089 | 8/1983 | Sharpe | 250/336.1 |
| 4,424,911 | 1/1984 | Resnick | 116/203 X |
| 4,538,139 | 8/1985 | Clemente | 340/545 X |
| 4,598,274 | 7/1986 | Holmes | 340/550 |
| 4,691,195 | 9/1987 | Sigelman et al. | 340/545 |
| 4,706,069 | 11/1987 | Tom et al. | 340/541 |
| 4,766,420 | 8/1988 | Hastings et al. | 340/550 |
| 4,770,527 | 9/1988 | Park | 356/28 |
| 4,835,435 | 5/1989 | Yeung et al. | 310/328 X |
| 4,888,581 | 12/1989 | Guscott | 340/565 X |
| 4,954,811 | 9/1990 | Chatigny et al. | 340/550 |
| 5,060,191 | 10/1991 | Nagasaki et al. | 365/145 |
| 5,315,204 | 5/1994 | Park | 310/339 |

FOREIGN PATENT DOCUMENTS

| | | | |
|---|---|---|---|
| 0245682 | 11/1987 | European Pat. Off. | 340/545 |

OTHER PUBLICATIONS

Boylestad et al., "Half-wave/Full-wave Rectification", *Electronic Devices and Circuit Theory*, pp. 59–65, 3rd Ed., Sep. 1982.

*Primary Examiner*—Jeffery A. Hofsass
*Assistant Examiner*—Thomas J. Mullen, Jr.

[57] ABSTRACT

A piezoelectric detecting system for detecting the opening of an enclosure without the need of an external battery or electrical system is disclosed. Several different piezoelectric sensor configurations to effect the detecting system are disclosed.

29 Claims, 5 Drawing Sheets

PENETRATION DETECTION SYSTEM

FIELD OF THE INVENTION

The present invention generally relates to security systems, and more particularly relates to a piezoelectric system for detecting and recording penetration of an enclosure without battery or external power. One preferred application of the invention is in detecting and recording penetration of a carrying case.

BACKGROUND OF THE INVENTION

Conventional physical security systems typically employ a breakwire system for detecting entry through the boundaries of a secured area or volume. A breakwire system consists of thin wire routed in serpentine fashion over the boundary surfaces of the area or volume to be protected. Current is passed through the wire in a continuous manner so that any penetration of the boundary surface will break the wire and interrupt the current flow. The interrupted current flow is detected by electronic circuitry which sounds an alarm. One disadvantage of a breakwire system is that to protect the secured area from very small penetrations, such as small diameter drilling, smaller diameter wire must be employed and routed with closer spacing. This significantly increases the cost of the system. In addition, the requirement for an external power source or battery is a disadvantage when the system is to be employed to surreptitiously detect penetrations of a portable object, such as a carrying case.

U.S. Pat. No. 4,954,811, issued Sep. 4, 1990, discloses a penetration sensor employing piezoelectric film. Transducers employing materials having both piezoelectric and pyroelectric characteristics, such as poled polyvinylidene fluoride films, are capable of detecting both temperature changes and vibrations within a wall. The signal produced by a stimulated transducer is supplied to a signal processor which, based on the generated waveform, recognizes the detected activity. Thus, if the signal corresponds to a single impact, such as a wind-blown object, an alarm signal would not be generated. However, if the generated waveform indicates a sudden increase of temperature, such as a fire or an attempted break-in using a torch, an alarm signal would be generated by the system. A system of the type disclosed in U.S. Pat. No. 4,954,811 would not, however, be applicable to a carrying case. Moreover, such a system does not efficiently record penetrations without a battery or external power source.

One goal of the present invention is to provide a sensing/recording system that does not require a battery or external power source to operate. A further goal of the invention is to provide a penetration detection system that may be employed in a "black box" enclosure, e.g., a carrying case, to detect and record penetration of the enclosure.

SUMMARY OF THE INVENTION

A penetration detection system in accordance with the present invention comprises a first sensing piezoelectric transducer comprising a first positive pole and a first negative pole, and a first memorizing piezoelectric transducer comprising a second positive pole operatively coupled to said first negative pole of said first sensing transducer and a second negative pole operatively coupled to said first positive pole of said first sensing transducer.

In preferred embodiments of the present invention, the memorizing transducer comprises a layer of piezoelectric material having a thickness selected such that, upon mechanical probing of the first sensing transducer, an electrical signal produced by the first sensing transducer will be sufficient to effect a reversal in the poling of the first memorizing transducer. In addition, the first sensing transducer may advantageously be, or include, a bimorph comprising first and second poled piezoelectric layers electrically coupled such that at least one pole of the first layer is electrically coupled to an opposite pole of the second layer. Preferred embodiments may also include a rectifier coupled between the first sensing and first memorizing transducers, and means for reading the polarity of the first memorizing transducer.

In other embodiments of the present invention, the first memorizing transducer comprises multiple layers of piezoelectric material coupled to the first sensing transducer such that, upon mechanical probing of the first sensing transducer, an indication of the level of an electrical signal produced by the first sensing transducer will be memorized by the first memorizing transducer.

The present invention also encompasses enclosures (e.g., a carrying case) comprising a plurality of walls arranged to define an enclosable space, a lid member openably associated with the walls, and security means, operatively coupled to the lid member, for detecting and recording a penetration of the enclosure without battery or line current. The security means in preferred embodiments comprises snap switch means for sensing a displacement of the lid member and generating a signal indicative thereof, the snap switch means comprising a first sensing piezoelectric transducer comprising a first positive pole and a first negative pole, and a first memorizing piezoelectric transducer comprising a second positive pole operatively coupled to the first negative pole of the first sensing transducer and a second negative pole operatively coupled to the first positive pole of the first sensing transducer.

The present invention also encompasses methods for detecting penetration of an enclosure comprising the steps of generating an electrical signal in response to a penetration of the enclosure, recording an indication of said penetration by employing the electrical signal to alter the polarization of a piezoelectric memory, and reading the polarization of the piezoelectric memory. Preferred embodiments may also comprise the steps of pre-poling the memory such that the electrical signal will effect a reversal in the poling of the memory, rectifying the electrical signal, and/or memorizing an indication of the magnitude of the electrical signal.

DETAILED DESCRIPTION OF PREFERRED EMBODIMENTS

Figure 1:
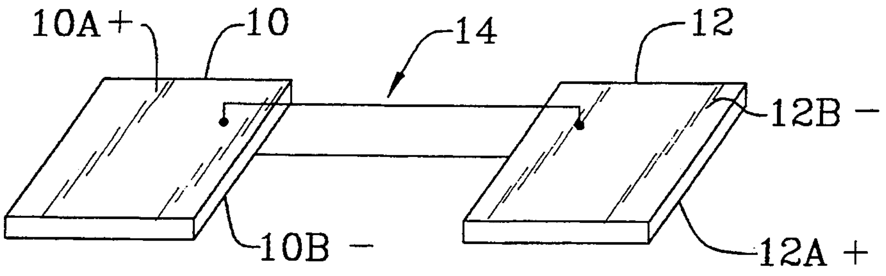
FIG. 1 illustrates the basic concept of coupling a piezoelectric sensor to a piezoelectric memory in accordance with the present invention.
Figure 2A:
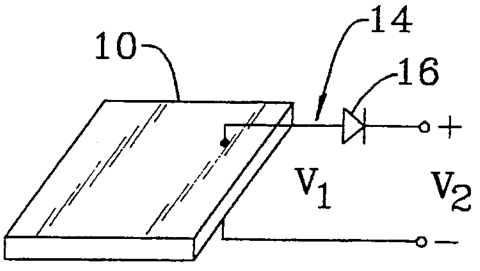
FIG. 2 at parts (a)–(e) depicts various arrangements of a piezoelectric sensor in combination with a rectifier.
Figure 2C:
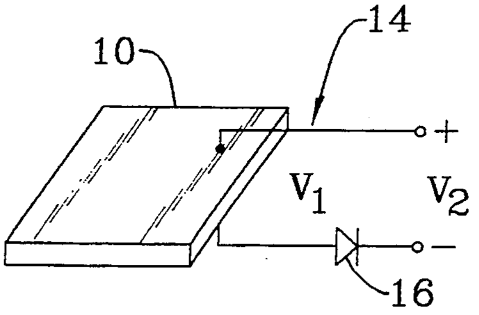
Figure 2B:
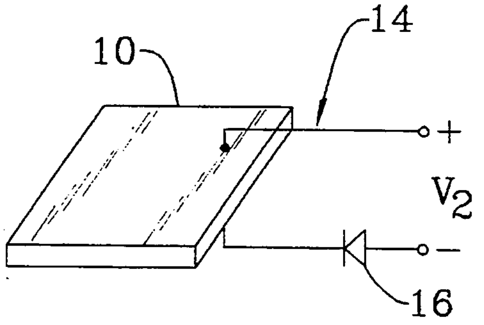
Figure 2D:
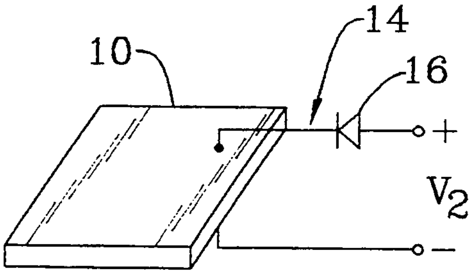
Figure 2E:
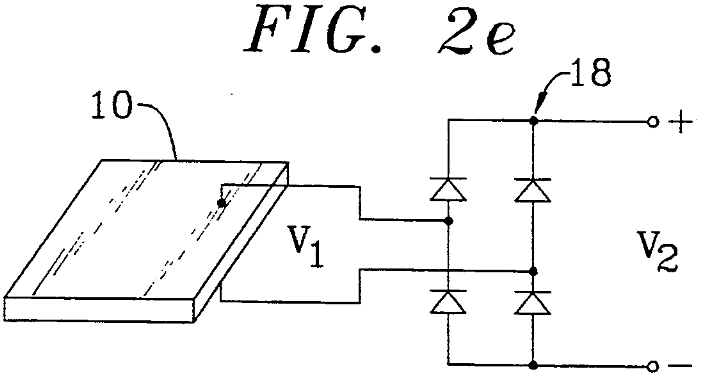
Figure 3A:
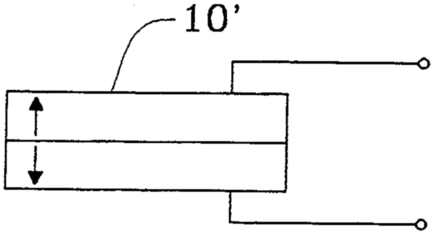
FIG. 3 at parts (a)–(d) depicts various embodiments of a piezoelectric bimorph sensor.
Figure 3C:
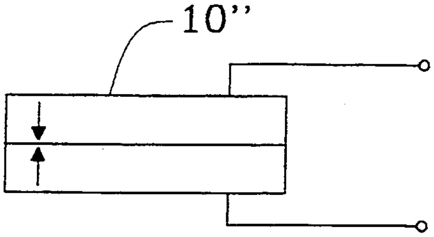
Figure 3B:
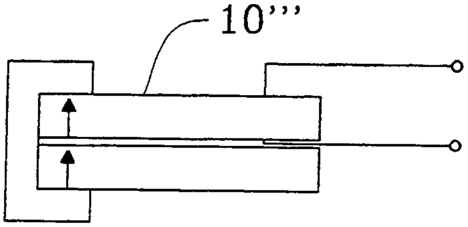
Figure 3D:
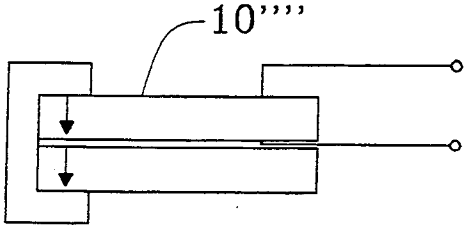

FIG. 1 depicts the basic concept of coupling a first piezoelectric transducer, or sensor, 10 to a second piezoelectric transducer, or memory, 12 with a pair of electrical conductors 14. As described below, this arrangement may be employed to provide a penetration detection system that operates without a battery or line current. According to the present invention, the first sensing transducer 10 comprises a positive pole 10A and a negative pole 10B; the memorizing transducer 12 comprises a positive pole 12A coupled to the negative pole 10B of the sensing transducer and a negative pole 12B coupled to the positive pole 10A of the sensing transducer. (Those familiar with piezoelectric materials understand that a piezoelectric transducer comprises a layer of piezoelectric material covered on its top and bottom surfaces by conductive electrodes, e.g., conductive ink or foil.) The memory 12 comprises a layer of piezoelectric material (e.g., piezo film or ceramic) having a thickness selected such that, upon mechanical probing of the sensor 10, an electrical signal produced by the sensor will be sufficient to effect a reversal in the poling of the memory 12. As described below, the memory 12 can thereafter be interrogated (read) to ascertain its polarity and thereby determine whether the sensor 10 has been probed. This assumes that the memory 12 has been pre-poled so that its initial polarization is known. An example of such a memory is a 0.1 $\mu$m thick, 0.1" by 0.1" piezo polymer; an example of a sensor is two layers of 28 $\mu$m thick, 12" by 12" piezo panels. The size/shape depend on the specific application. Those skilled in the art will recognize that the present invention may be applied in a variety of situations requiring passive, non-real-time detection and recording.

FIG. 2 depicts various arrangements of a piezoelectric sensor 10 in combination with a rectifier (the memory 12 is not shown). FIG. 2 parts (a)–(d) depict various configurations of a diode 16 (a half-wave rectifier) inserted at different positions in conductor 14; part (d) illustrates an embodiment employing a full-wave rectifier 18. The knee (turn-on) voltage $V_K$ of a diode is typically 0.7 V for silicon and 0.3 V for germanium; therefore, for example, in the embodiments of parts (a)–(d), the voltage $V_2$ will be approximately 0.7 V or 0.3 V less than the voltage generated by the sensor 10. This factor should be considered when deciding what size to make the sensor 10 and memory 12, since the voltage generated by the sensor and the voltage required to alter the polarization of the memory will be a function of the respective thicknesses of the sensor and memory. The knee voltage $V_K$ may also be employed to desensitize the system to noise voltage below $V_K$.

FIG. 3 depicts various embodiments of a piezoelectric bimorph sensor for use in preferred embodiments of the present invention. Parts (a) and (c) respectively depict embodiments 10', 10" in which the two layers of piezoelectric material (e.g., film or ceramic) are connected in series, and parts (b) and (d) depict embodiments 10''', 10'''' in which the two layers are connected in parallel. Those familiar with piezoelectric materials understand that a bimorph typically comprises two layers of piezoelectric material separated by a conductive electrode and covered on its top and bottom surfaces by conductive electrodes; however, the sensors 10' and 10" of parts (a) and (c) do not require an electrode separating the top and bottom layers. The bimorph configuration of the sensor 10 is advantageous in that it minimizes vibration and pyro-related noise. In preferred embodiments of the invention, a bimorph sensor comprises first and second poled piezoelectric layers electrically coupled such that at least one pole of the first layer is electrically coupled to an opposite pole of the second layer.

Figure 4A:
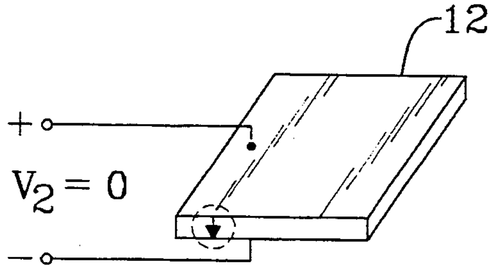
FIG. 4 at parts (a) and (b) illustrates the use of a piezoelectric memory in accordance with the present invention.
Figure 4B:
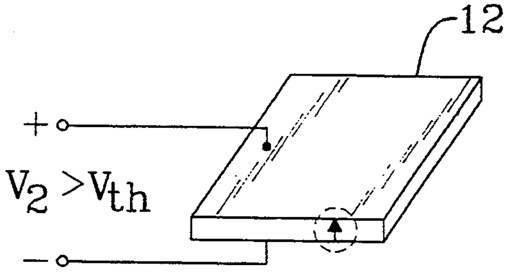

FIG. 4 focuses on the piezoelectric memory 12, in particular the use of a voltage $V_2$ output by a rectifier coupled to a sensor as depicted in FIG. 2 to change the polarity of a piezoelectric memory device 12. Part (a) shows the memory 12 in its pre-poled state, indicated by the downward arrow, with $V_2$ equal to zero. Part (b) shows the change in polarity of the memory 12 upon application of a positive voltage. The magnitude of the voltage will depend upon the strength of the force acting on the sensor (in FIG. 4*b*, $V_{th}$ represents the voltage required to reverse the poling polarity). It should also be noted that the memory 12 need not be a binary memory in the sense that it can only be set to two polarization states. By appropriately stacking a plurality of transducers of the same or different thicknesses, an indication of the magnitude of the voltage provided by the sensor may be obtained; this indication would also be indicative of the force applied to the sensor, which could be useful information in a penetration detection system.

Figure 5A:
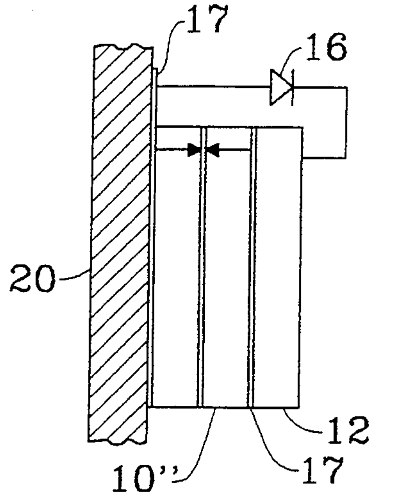
FIG. 5 at parts (a) and (b) depicts two applications of a penetration detection system in accordance with the present invention.
Figure 5B:
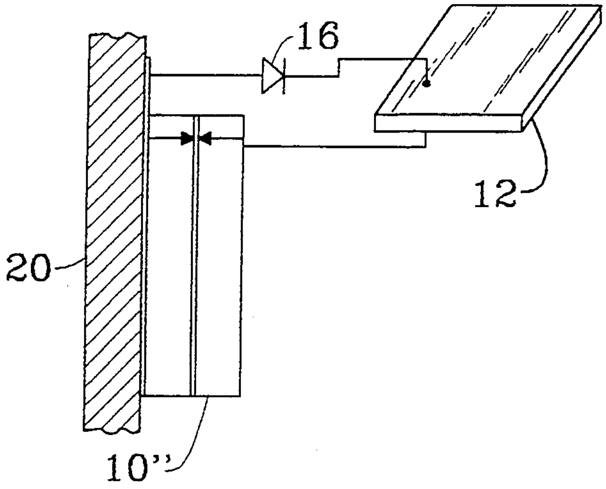

FIG. 5 at parts (a) and (b) depicts two applications of a penetration detection system in accordance with the present invention. Part (a) shows the bimorph sensor 10" physically attached to the memory 12 and electrically connected to the memory via diode 16 and electrodes 17. The entire arrangement is shown mounted on a wall 20. Part (b) depicts an alternative embodiment in which the memory 12 is remote from the sensor 10".

Figure 6:
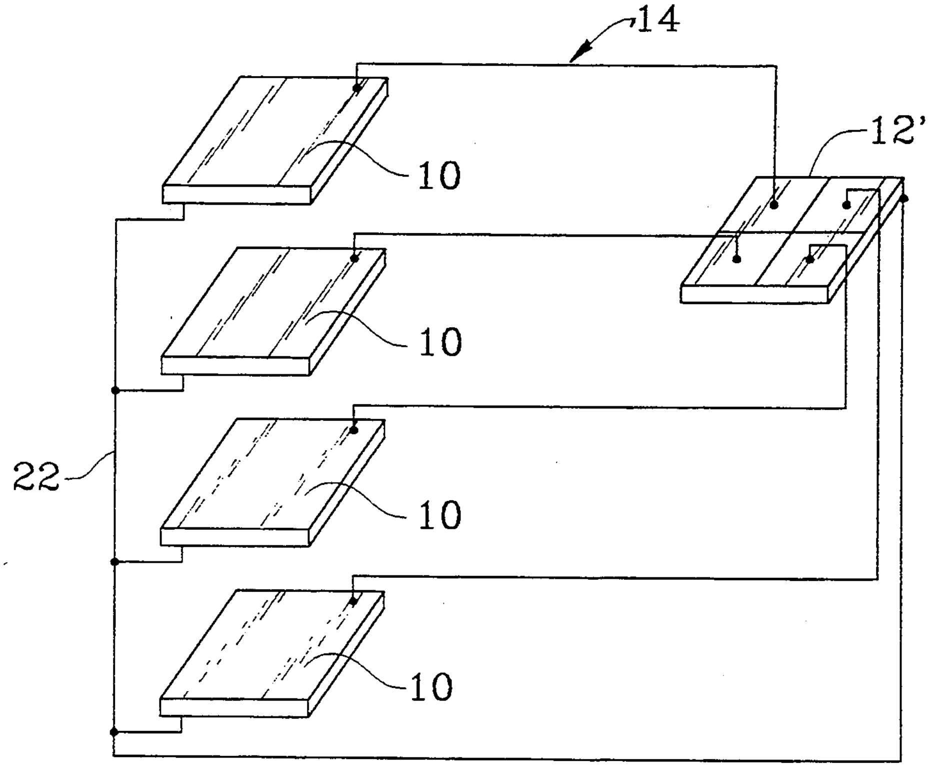
FIG. 6 depicts a multi-zone penetration detection system in accordance with the present invention.

FIG. 6 depicts a multi-zone penetration detection system in accordance with the present invention. In this embodiment of the invention, there are multiple sensors 10 coupled to one another by a common conductor 22 and coupled to multiple memories or a memory array 12'. The memory array 12' can be scanned by using known X–Y scanning or multiplexing methods. A thin memory film or ceramic array can be bonded on a Silicon wafer (IC chip) so that signal analysis and multiplexer processors (if needed) can be located just under the memory array. Power can be applied to the wafer and the memory array can be scanned to determine whether a penetration has occurred in any of the sensor zones.

Figure 7:
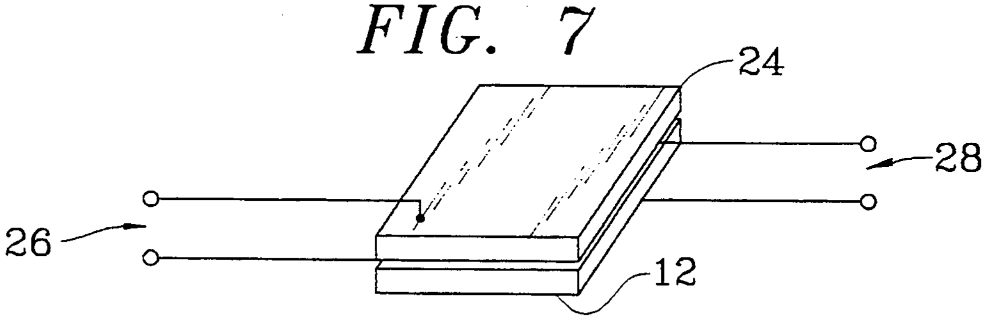
FIG. 7 illustrates one embodiment of a means for reading out the polarity of a piezoelectric memory.

Preferred embodiments of the present invention may also include means for reading the polarity of the memorizing transducer. FIG. 7 illustrates one embodiment of a reading means employing a heat source 24; e.g., a thin, flexible, low power, plastic-like heating element is commercially available. In this arrangement, power applied at terminals 26 will cause the memory 12 to generate a positive or negative voltage across terminals 28; the polarity of the voltage across terminals 28 can be monitored to determine whether the polarity of the memory 12 has been reversed.

Figure 8:
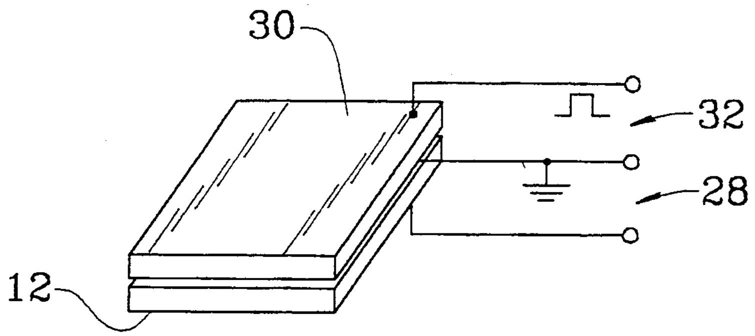
FIG. 8 illustrates a second embodiment of a means for reading out the polarity of a piezoelectric memory.

FIG. 8 illustrates a second embodiment of a means for reading out the polarity of a piezoelectric memory. In this embodiment, a piezo film or ceramic layer 30 is electrically pulsed at terminals 32 and employed as an actuator or speaker to mechanically excite memory 12 into generating a voltage across terminals 28.

Figure 9:
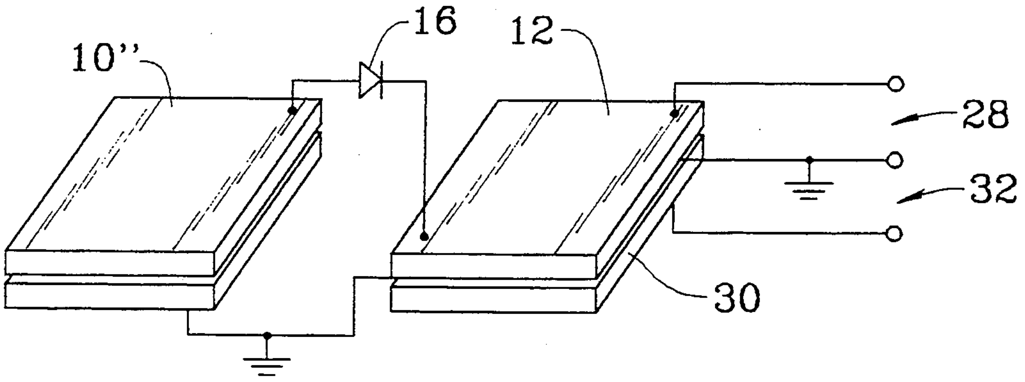
FIG. 9 depicts another embodiment of a penetration detection system in accordance with the present invention.

FIG. 9 depicts a penetration detection system comprising a combination of some of the above-described elements. This embodiment includes a bimorph sensor 12, diode rectifier 16, memory 12, and read-out actuator 30. This embodiment is just one example of a penetration detection system in accordance with the present invention. Many other combinations of the elements described above may be employed.

Figure 10:
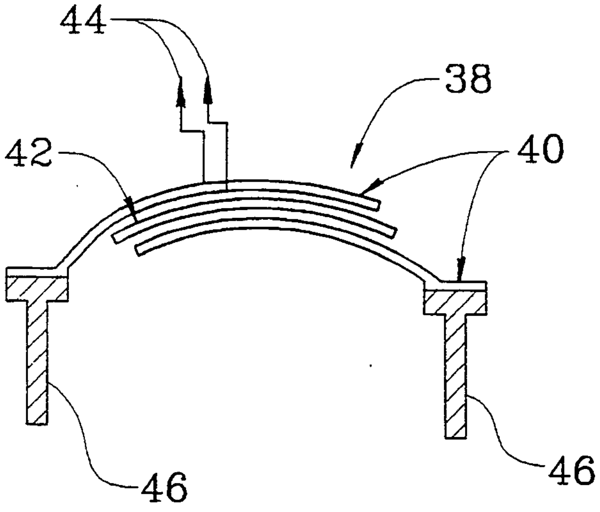
FIG. 10 depicts a snap switch suitable for use in another embodiment of a penetration detection system in accordance with the present invention.

FIG. 10 depicts a snap switch suitable for use in another embodiment of penetration detection system in accordance with the present invention. The snap switch comprises a pair of snap domes 40, a piezo film sensor 42, electrodes 44 and pins 46. This switch is described in U.S. patent application Ser. No. 509,483, filed Apr. 16, 1990 (titled *Piezoelectric Snap Action Switch*), which is hereby incorporated by reference into this specification.

Figure 11A:
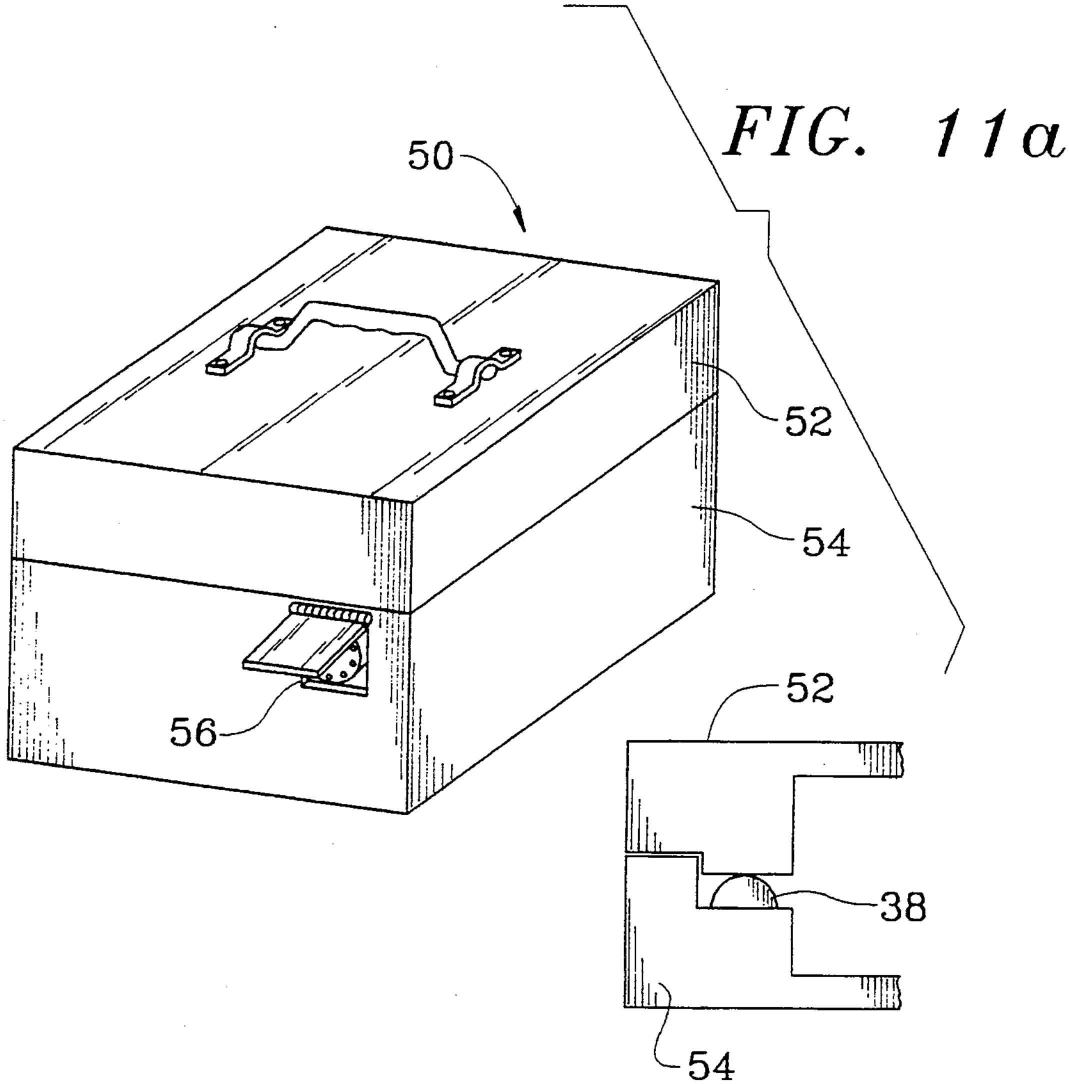
FIG. 11A depicts an enclosure (a carrying case) embodying a penetration detection system in accordance with the present invention.
Figure 11B:
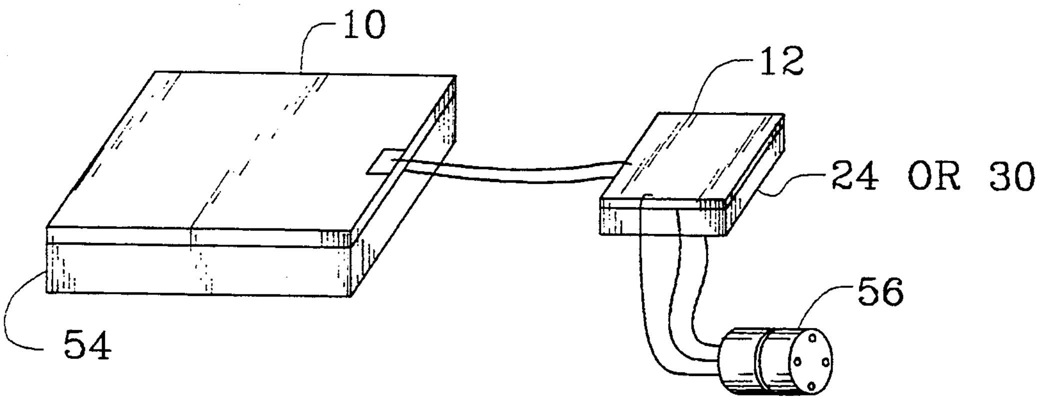
FIG. 11B depicts an exploded view of the carrying case of FIG. 11A.

FIG. 11A depicts an enclosure, i.e., a carrying case 50, embodying a penetration detection system in accordance with the present invention; FIG. 11B depicts an exploded view of the carrying case. The carrying case 50 comprises a plurality of walls 54 and a lid member 52 movable in relation to the walls 54 to permit access to the enclosed space. In addition, the case 50 contains a security system comprising a snap switch of the type described above in connection with FIG. 10 and a memory 12 (FIG. 11B). (Alternatively, the carrying case could be lined with a piezoelectric sensor coupled to a memory as described above. This arrangement would detect and record drilling and burning into the walls of the case.) The snap switch is coupled to the lid member 52 such that, upon opening of the lid, the switch generates a voltage that is recorded by the memory. A read only port 56 provides access to a board (not shown), bearing the memory 12 and other passive electronic components, for reading the memory. The snap switch could be placed, e.g., between the top cover wall and a side wall such that it is compressed while the cover is closed and pops up, generating a signal, when the cover is opened.

The true scope of the present invention is not limited to the exemplary embodiments described above. Those skilled in the art will readily appreciate that many modifications and variations of those examples fall within the true scope of the invention. Accordingly, the foregoing description of preferred embodiments is not intended to limit the scope of protection of the following claims.

I claim:

1. A penetration detection system, comprising:

(a) a first sensing piezoelectric transducer comprising a first positive pole and a first negative pole; and (b) a first memorizing piezoelectric transducer comprising a second positive pole operatively coupled to said first negative pole of said first sensing transducer and a second negative pole operatively coupled to said first positive pole of said first sensing transducer.

2. A penetration detection system according to claim 1, wherein said memorizing transducer comprises a layer of piezoelectric material having a thickness selected such that, upon mechanical probing of said first sensing transducer, an electrical signal produced by said first sensing transducer will be sufficient to effect a reversal in the positive to negative and negative to positive polarization of said first memorizing transducer while the polarization of said first sensing transducer remains unchanged.

3. A penetration detection system according to claim 2, wherein said first sensing transducer is a bimorph comprising first and second poled piezoelectric layers electrically coupled such that at least one pole of said first layer is electrically coupled to an opposite pole of said second layer.

4. A penetration detection system according to claim 3, further comprising a rectifier coupled between said first sensing and first memorizing transducers.

5. A penetration detection system according to claim 3, further comprising means for reading the polarity of said first memorizing transducer.

6. A penetration detection system according to claim 1, wherein said first sensing transducer is a bimorph comprising first and second poled piezoelectric layers electrically coupled such that at least one pole of said first layer is electrically coupled to an opposite pole of said second layer.

7. A penetration detection system according to claim 1, further comprising a rectifier coupled between said first sensing and first memorizing transducers.

8. A penetration detection system according to claim 7, wherein said rectifier is a diode.

9. A penetration detection system according to claim 7, wherein said rectifier is a full wave rectifier.

10. A penetration detection system according to claim 1, further comprising a second sensing piezoelectric transducer comprising a third positive pole and a third negative pole, and a second memorizing piezoelectric transducer comprising a fourth positive pole operatively coupled to said third negative pole and a fourth negative pole operatively coupled to said third positive pole, whereby multiple sensing zones are provided.

11. A penetration detection system according to claim 1, further comprising means for reading the polarity of said first memorizing transducer.

12. A penetration detection system according to claim 1, wherein said first memorizing transducer comprises multiple layers of piezoelectric material coupled to said first sensing transducer such that, upon mechanical probing of said first sensing transducer, an indication of the level of an electrical signal produced by said first sensing transducer will be memorized by said first memorizing transducer.

13. A penetration detection system according to claim 1, further comprising a carrier attached to said sensing transducer and a carrier attached to said memorizing transducer.

14. A penetration detection system according to claim 13, wherein said carriers comprise one of the group: silicon and glass.

15. A penetration detection system according to claim 1, wherein said sensing and memorizing piezoelectric transducers comprise piezoelectric film.

16. A penetration detection system according to claim 1, wherein said sensing and memorizing piezoelectric transducers comprise a piezoelectric ceramic material.

17. An enclosure, comprising:

(a) a base;

(b) a plurality of walls upstanding from said base;

(c) a lid hingeably mounted to one of said walls;

(d) a piezoelectric sensor operatively coupled to said lid for detecting movement of said lid; where said piezoelectric sensor includes a first sensing transducer and a first memorizing transducer;

(e) means for reading the polarity of said first memorizing transducer, whereby the movement of said lid is recorded; and said first sensing transducer has a first positive pole and a first negative pole; and said first memorizing transducer has a second positive pole operatively coupled to said first negative pole of said first sensing transducer and a second negative pole operatively coupled to said first positive pole of said first sensing transducer.

18. An enclosure according to claim 17, wherein said piezoelectric sensor senses a displacement of said lid and generates a signal responsive thereto.

19. An enclosure according to claim 17, wherein said first sensing transducer is a bimorph comprising first and second poled piezoelectric layers electrically coupled such that at least one pole of said first layer is electrically coupled to an opposite pole of said second layer.

20. An enclosure according to claim 19, further comprising a rectifier coupled between said first sensing and first memorizing transducers.

21. An enclosure according to claim 20, wherein said rectifier is a diode.

22. An enclosure according to claim 20, wherein said rectifier is a full wave rectifier.

23. An enclosure according to claim 17, further comprising a rectifier coupled between said first sensing and first memorizing transducers.

24. An enclosure according to claim 17, further comprising a second sensing piezoelectric transducer comprising a third positive pole and a third negative pole, and a second memorizing piezoelectric transducer comprising a fourth positive pole operatively coupled to said third negative pole and a fourth negative pole operatively coupled to said third positive pole, whereby multiple sensing zones are provided.

25. An enclosure according to claim 17, wherein said first memorizing transducer comprises multiple layers of piezoelectric material coupled to said first sensing transducer such that, upon mechanical probing of said first sensing transducer, an indication of the level of an electrical signal produced by said first sensing transducer will be memorized by said first memorizing transducer.

26. An enclosure according to claim 17, further comprising a carrier attached to said sensing transducer and a carrier attached to said memorizing transducer.

27. An enclosure according to claim 26, wherein said carriers comprise one of the group: silicon and glass.

28. An enclosure according to claim 17, wherein said sensing and memorizing piezoelectric transducers comprise piezoelectric film.

29. An enclosure according to claim 17, wherein said sensing and memorizing piezoelectric transducers comprise a piezoelectric ceramic material.

* * * * *